(12) United States Patent
Culmsee et al.

(10) Patent No.: US 7,544,553 B2
(45) Date of Patent: Jun. 9, 2009

(54) INTEGRATION SCHEME FOR FULLY SILICIDED GATE

(75) Inventors: Marcus Culmsee, Wappingers Falls, NY (US); Hermann Wendt, Poughkeepsie, NY (US); Lothar Doni, Fishkill, NY (US)

(73) Assignee: Infineon Technologies AG, Munich (DE)

( * ) Notice: Subject to any disclaimer, the term of this patent is extended or adjusted under 35 U.S.C. 154(b) by 130 days.

(21) Appl. No.: 11/094,367

(22) Filed: Mar. 30, 2005

(65) Prior Publication Data

US 2006/0228844 A1    Oct. 12, 2006

(51) Int. Cl.
*H01L 23/336* (2006.01)
*H01L 21/3205* (2006.01)

(52) U.S. Cl. .................. 438/197; 438/305; 438/592; 438/655

(58) Field of Classification Search .......... 438/197, 438/305, 664, 655, 592
See application file for complete search history.

(56) References Cited

U.S. PATENT DOCUMENTS

| | | | | |
|---|---|---|---|---|
| 5,225,896 | A * | 7/1993 | Van Roozendaal et al. | 257/356 |
| 5,891,784 | A * | 4/1999 | Cheung et al. | 438/303 |
| 6,013,569 | A * | 1/2000 | Lur et al. | 438/595 |
| 6,080,648 | A * | 6/2000 | Nagashima | 438/592 |
| 6,087,271 | A | 7/2000 | En et al. | |
| 6,090,653 | A * | 7/2000 | Wu | 438/231 |
| 6,100,173 | A * | 8/2000 | Gardner et al. | 438/592 |
| 6,271,133 | B1 * | 8/2001 | Lim et al. | 438/683 |
| 6,287,925 | B1 * | 9/2001 | Yu | 438/301 |
| 6,479,166 | B1 * | 11/2002 | Heuer et al. | 428/620 |
| 6,555,453 | B1 | 4/2003 | Xiang et al. | |
| 6,777,759 | B1 * | 8/2004 | Chau et al. | 257/377 |
| 6,784,101 | B1 * | 8/2004 | Yu et al. | 438/666 |
| 6,787,424 | B1 | 9/2004 | Yu | |
| 7,101,776 | B2 * | 9/2006 | Yoo et al. | 438/592 |
| 2003/0181028 | A1 | 9/2003 | Yeap et al. | |
| 2004/0038435 | A1 * | 2/2004 | Wieczorek et al. | 438/13 |
| 2005/0037558 | A1 | 2/2005 | Gong et al. | |
| 2006/0172492 | A1 | 8/2006 | Froment et al. | |

FOREIGN PATENT DOCUMENTS

| | | |
|---|---|---|
| EP | 1 463 102 A2 | 9/2004 |
| EP | 1 496 541 A1 | 1/2005 |
| WO | WO 2004/057659 A1 | 7/2004 |

* cited by examiner

*Primary Examiner*—Michael Trinh
(74) *Attorney, Agent, or Firm*—Slater & Matsil, L.L.P.

(57) ABSTRACT

To form a semiconductor device, a silicon (e.g., polysilicon) gate layer is formed over a gate dielectric and a sacrificial layer (preferably titanium nitride) is formed over the silicon gate layer. The silicon gate layer and the sacrificial layer are patterned to form a gate structure. A spacer, such as an oxide sidewall spacer and a nitride sidewall spacer, is formed adjacent the sidewall of the gate structure. The semiconductor body is then doped to form a source region and a drain region that are self-aligned to the spacers. The sacrificial layer can then be removed selectively with respect to the oxide sidewall spacer, the nitride sidewall spacer and the silicon gate. A metal layer (e.g., nickel) is formed over the source region, the drain region and the silicon gate and reacted with these regions to form a silicided source contact, a silicided drain contact and a silicided gate.

28 Claims, 2 Drawing Sheets

US 7,544,553 B2

INTEGRATION SCHEME FOR FULLY SILICIDED GATE

TECHNICAL FIELD

This invention relates generally to semiconductor devices, and more particularly to an integration scheme for a fully silicided gate.

BACKGROUND

Semiconductor devices are used in a variety of electronic applications, such as personal computers and cellular phones, for example. The semiconductor industry in general is being driven to decrease the size of semiconductor devices located on integrated circuits. Miniaturization is generally needed to accommodate the increasing density of circuits necessary for today's semiconductor products.

One common technology is complementary metal oxide semiconductor (CMOS), which is preferred because components can be fabricated to operate at relatively low power rates. An example of a MOS transistor 10 is shown in FIG. 1. The transistor 10 includes a source 12 and a drain 14, which are both formed in a semiconductor substrate 16. A gate 18 overlies a channel 20 between the source 14 and drain 16 and is insulated therefrom by a gate dielectric 22. Also illustrated are shallow trench isolation regions 24, which can serve to isolate transistor 10 from neighboring devices.

In many applications, the gate 18 is formed from doped polysilicon. It is often desirable that the resistance of the doped polysilicon gate 18 be lowered. One way to achieve this goal is to form a silicide layer 30 over the gate polysilicon 18. The silicide material has a lower resistance than the polysilicon and therefore the overall conductivity of the gate will be higher. Similarly, silicide regions 26 and 28 can be formed over the source 12 and drain 14, respectively, to lower the contact resistance to these regions. In one example, the silicide regions 26, 28 and 30 can be formed using a salicide (self-aligned silicide) process where a blanket layer of a refractory metal is deposited over the transistor and reacted with any exposed silicon (e.g., the silicon of the source 14, drain 16 and gate 18). Unreacted refractory metal can then be removed.

One type of transistor technology that is developing uses a fully silicided (FUSI) gate. For example, a refractory metal can be deposited on a patterned polysilicon gate. A sintering process can then be performed so that a diffusion between the metal and the polysilicon occurs, leading to a full reaction down to the gate dielectric interface. Such a gate can have advantages over polysilicon gates by reducing the effects of gate depletion and dopant penetration.

SUMMARY OF THE INVENTION

In one aspect, the present invention provides an integration scheme to form a fully silicided gate. For example, in a preferred embodiment method, a silicon (e.g., polysilicon) gate layer is formed over a gate dielectric and a sacrificial layer (preferably titanium nitride) is formed over the silicon gate layer. The silicon gate layer and the sacrificial layer are patterned to form a gate structure. A spacer, such as an oxide sidewall spacer and a nitride sidewall spacer, is formed adjacent the sidewall of the gate structure. The semiconductor body is then doped to form a source region and a drain region that are self-aligned to the spacers. The sacrificial layer can then be removed selectively with respect to the oxide sidewall spacer, the nitride sidewall spacer and the silicon gate. A metal layer (e.g., nickel) is formed over the source region, the drain region and the silicon gate and reacted with these regions to form a silicided source contact, a silicided drain contact and a silicided gate.

Using embodiments of the present invention, the source, drain and gate can all be silicided in a single process step. Further, by strategically selecting a sacrificial material with appropriate etch selectivity, a transistor structure that includes silicon oxide, silicon nitride and silicon can be formed without degradation.

The details of one or more embodiments of the invention are set forth in the accompanying drawings and the description below. Other features and advantages of the invention will be apparent from the description and drawings, and from the claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely a MOS transistor. The invention may also be applied, however, to other semiconductor structures.

Figure 2:
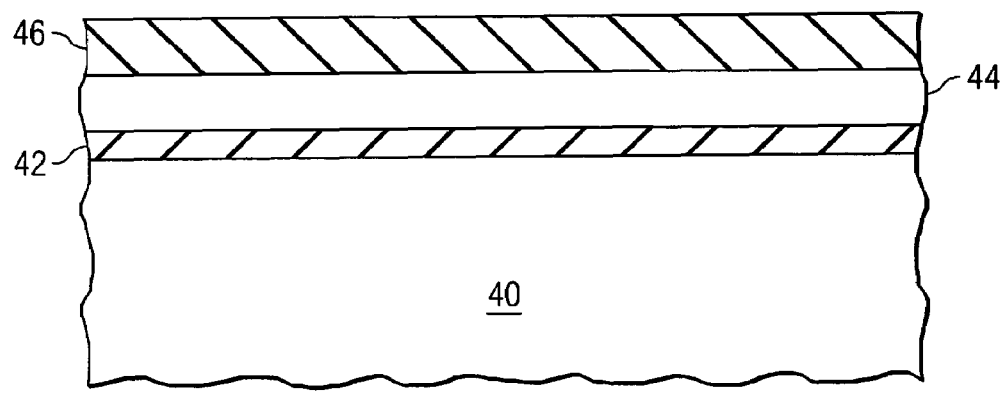
FIGS. 2-6 are cross-sectional views during various stages of fabrication of a transistor of the present invention.

A preferred embodiment of the present invention will now be described with respect to a specific example, namely the formation of a MOS transistor that includes a silicided gate, preferably a fully silicided gate. FIG. 2 shows a cross-section of a first stage of fabrication of such a device. A semiconductor body 40 preferably comprises monocrystalline silicon. This body 40 can be a bulk semiconductor substrate, a layer formed over a substrate (e.g., an epitaxially grown layer or a silicon-on-insulator layer), or a region within another body (e.g., a well). Further, other semiconductors such as silicon germanium, gallium arsenide can be used.

A dielectric layer 42 is formed over the semiconductor body 40. In one embodiment, the dielectric layer 42 comprises an oxide such as silicon dioxide. In other embodiments, the dielectric can comprise a nitride such as silicon nitride or a combination of oxide and nitride (e.g., silicon oxynitride or oxide-nitride-oxide). In yet other embodiments, the dielectric can be a high-k dielectric (i.e., a dielectric with a dielectric constant greater than that of $Si_3N_4$. For example, the dielectric can be a hafnium based dielectric.

A conductive gate layer 44 is formed over the dielectric layer 42. In the preferred embodiment, the conductive gate layer comprises a silicon layer, in particular polysilicon. The polysilicon can be doped in situ or after being deposited. In other embodiments, amorphous silicon can be deposited. The gate layer 44 is preferably deposited to a thickness between about 20 nm and about 60 nm, preferably about 30 nm.

A sacrificial layer 46 is formed over the conductive gate layer 44. The sacrificial layer is preferably formed from a material that can be etched selectively with respect to other materials in the device, the other materials typically being silicon, silicon oxide and silicon nitride. The sacrificial layer should also be compatible with adjacent materials, preferably being applied without use of barriers or other layers.

In the preferred embodiment, the sacrificial layer is formed from titanium nitride. The TiN can be stoichiometric (i.e., equal amounts of Ti and N atoms) or not. This material is preferred because it can be etched selectively with respect to silicon, silicon oxide and silicon nitride. Further the TiN 46 can be directly deposited on the polysilicon 44 without any intervening layers. If another sacrificial layer, for example aluminum, were to be used, a barrier layer (e.g., Ti and/or TiN) should be used to avoid interaction between the aluminum and the underlying silicon as well as to avoid an oxidation of the aluminum at its surface. The TiN 46 is preferably deposited to a thickness determined by the needs of the necessary spacer dimensions (e.g., between about 60 nm and about 100 nm, preferably about 90 nm). In various embodiments, the thicknesses of the TiN and polysilicon will be adjusted based upon the different silicidation rates of polysilicon (for the gate) and single crystal silicon (for the source and drain).

Figure 3:
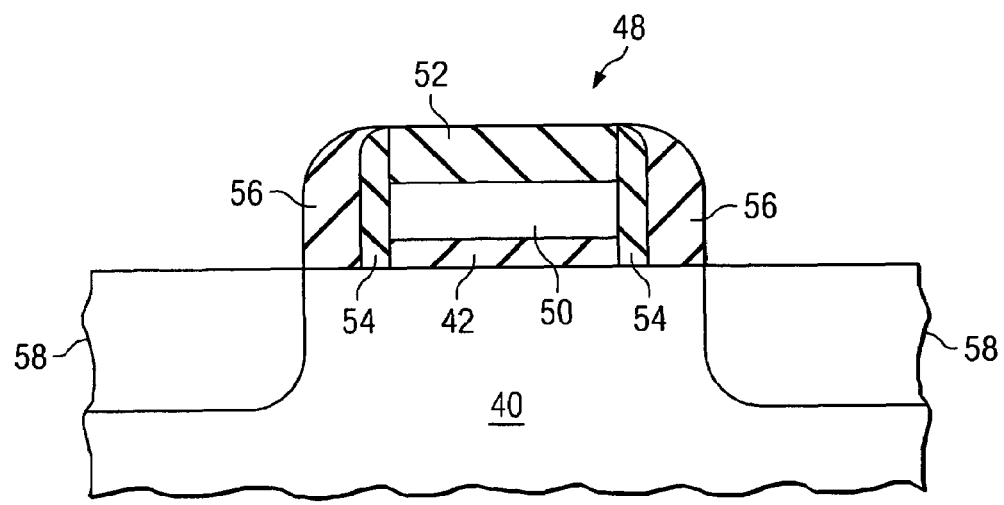

Referring now to FIG. 3, the conductive gate layer 44 and sacrificial layer 46 (and possibly the gate dielectric layer 42) are patterned, e.g., using a mask which is not shown, into the shape of the gate structure 48. The gate structure 48 includes the silicon gate 50 and the sacrificial gate 52. While only a single gate structure 48 is illustrated, it is understood that many (e.g., thousands or millions) of similar structures can be formed simultaneously.

At this point, lightly doped source and drain regions (not shown) can be formed by ion implantation. For n-channel transistors, the dopants are preferably arsenic or phosphorus while, for p-channel transistors, the dopants are preferably boron. Other dopant species could alternatively be used. These lightly doped regions are preferably implanted in a manner self-aligned to the gate structure 48.

Next a sidewall spacer is formed adjacent the sidewalls of the gate structure 48. In the preferred embodiment, an oxide layer (not shown) is conformally deposited and anisotropically etched back to a desired height. Subsequently, a nitride layer is conformally deposited and anisotropically etched back. In the preferred embodiment, the oxide layer is $SiO_2$ and the nitride layer is $Si_3N_4$, but it is understood that other oxide and/or nitride materials can be used. This processing will form oxide spacer 54 and nitride spacer 56. Further, it is preferable, but not required, that the nitride layer be formed over the oxide so that the nitride can serve as an etch stop during source/drain contact hole etches. Further, other embodiments may include only a single spacer or more than two spacers (e.g., three spacers). Use of both an oxide spacer 54 and a nitride spacer 56 is desirable since use of only a single spacer can adversely stress the structure.

After forming the sidewall spacer 54/56, source and drain regions 58 can be formed. In the preferred embodiment, the source and drain regions 58 are formed by implanting dopants in a manner that is self-aligned to the spacers 54/56. The doping concentration, dose and energy levels are not critical to the invention. As with the lightly doped regions, for n-channel transistors, the dopants are preferably arsenic or phosphorus while, for p-channel transistors, the dopants are preferably boron. Once again, other dopant species could alternatively be used.

Figure 4:
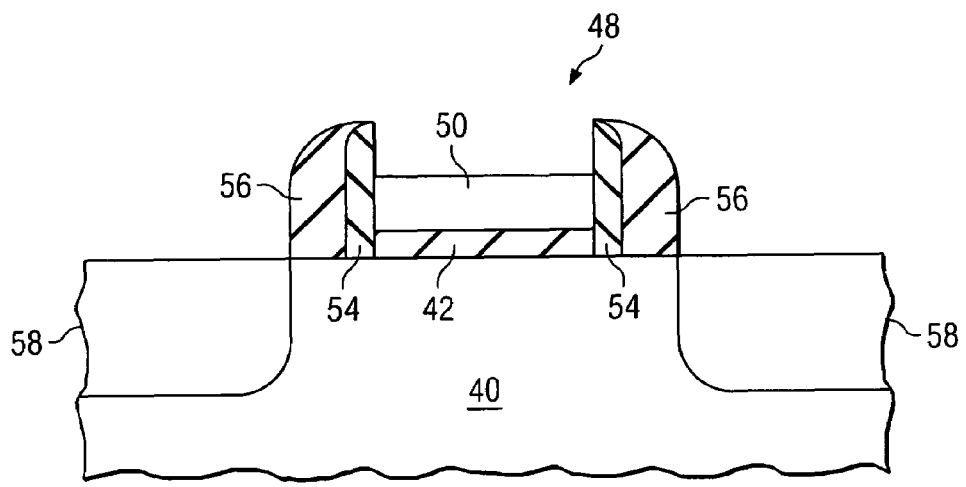

Referring now to FIG. 4, the sacrificial gate 52 is removed selectively with respect to the sidewall spacer (e.g., the oxide sidewall spacer and the nitride sidewall spacer) and the gate region 50. In the case where the sacrificial gate 52 is formed from TiN, this selective removal can be performed with an etch using an aqueous solution that includes $NH_3$ and $H_2O_2$. In another example, an etch can be performed at about 50° C. with a mixing ratio $H_2O:NH_4OH$ (30%):$H_2O_2$ (30%) approximately 50:2:1. Such an etch should selectively remove the TiN without substantially removing material of the sidewall spacer 54/56, polysilicon of the gate structure 50 or silicon of the source and drain regions 58. If another sacrificial material(s) is used, then the etching solution can be chosen accordingly.

Figure 5:
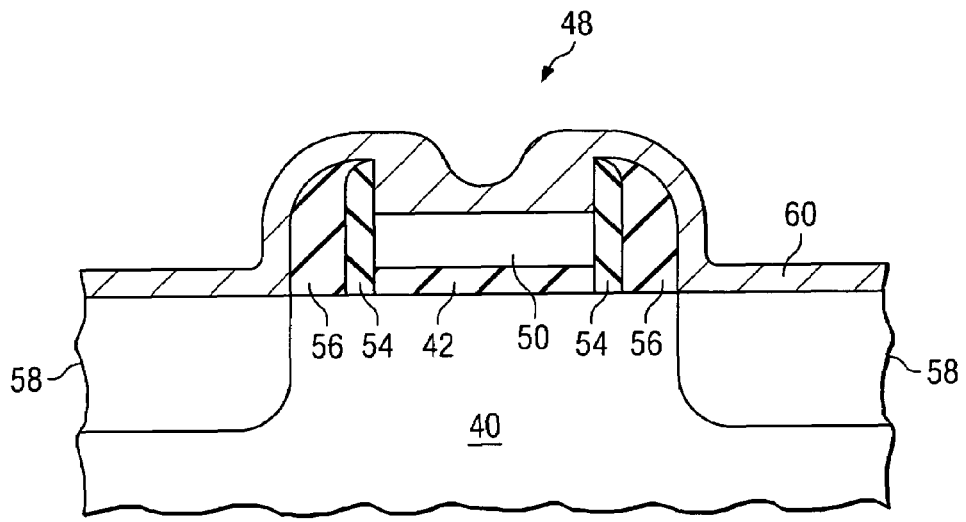

FIG. 5 shows the deposition of metal layer 60 over the source and drain region 58 and the gate 50. In the preferred embodiment, the metal layer 60 is formed from nickel. For example, a nickel layer can be deposited by chemical vapor deposition using $Ni(CO)_4$ as a precursor. In the preferred embodiment, this material is deposited at atmospheric pressure and at a temperature of about 180° C. to about 230° C. (Mond process). Other deposition techniques such as physical vapor deposition or evaporation can alternatively be used. The thickness of metal layer 60 is preferably between about 5 nm and about 15 nm, preferably about 10 nm. In other embodiments, other metals such as cobalt, tantalum, titanium, platinum or molybdenum including their alloys (e.g., $Ni_xPt_y$) can be used.

Figure 6:
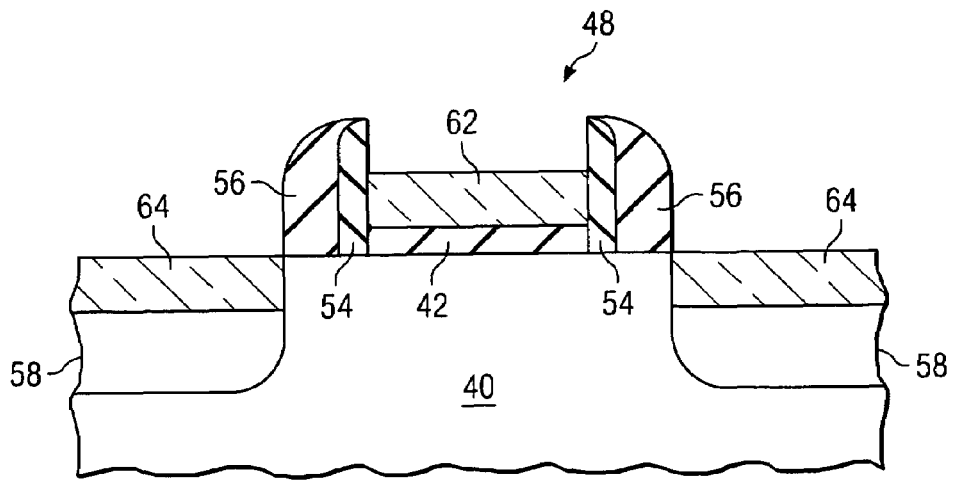

FIG. 6 shows the structure after the metal layer 60 has been reacted with silicon regions 50 and 58 and the unreacted portions of the metal layer have been removed. In the preferred embodiment, this reaction takes place at a temperature of about 400° C. for a time of about 5 seconds, followed by a spike anneal at about 500° C. after the excess metal is removed. This silicidation process will form nickel silicide (or another silicide material depending upon the metal in layer 60). The silicide regions 64 will serve to lower source/drain contact resistance and can have a thickness of between about 20 nm and about 50 nm.

At the same time that silicide regions 64 are formed, the gate 50 will preferably, but not necessarily, become fully silicided. The fully silicided gate is labeled with reference numeral 62 in FIG. 6. This fully silicided gate 62 can have a thickness of between about 20 nm and about 50 nm.

Figure 1:
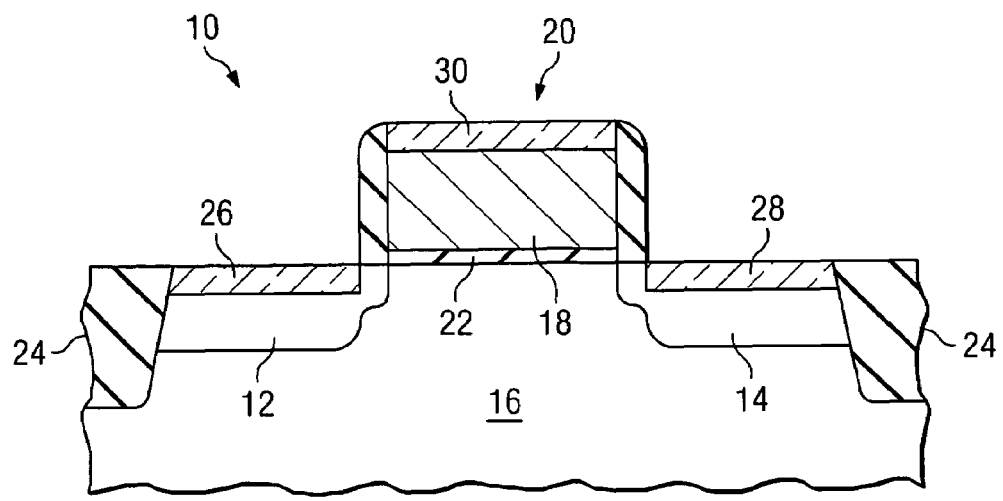
FIG. 1 is a cross-sectional view of a conventional transistor.

As noted above, the unreacted portions of the metal layer 60 have been removed. This unreacted metal includes portions of the metal layer 60 over the sidewall spacers 54/56 and over the isolation regions (not shown; see e.g., FIG. 1). Removal of these conductors prevents conductive shorts from being formed on the chip. In the preferred embodiment, this removal process is performed with aqua regia as an etch chemistry.

While not shown, the device as shown can be covered with a dielectric layer, such as an oxide or a doped oxide. Contact holes can be etched into this dielectric layer and conductive plugs formed to electrically contact the source/drain regions 58 and gate 62, as desired. Other features such as the metallization are also omitted for the sake of simplicity.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method for forming a semiconductor device, the method comprising:
    forming a gate dielectric over a semiconductor body;
    forming a silicon gate layer over the gate dielectric;
    forming a sacrificial layer over the silicon gate layer, wherein forming the sacrificial layer comprises depositing a titanium nitride layer;
    patterning the silicon gate layer and the sacrificial layer to form a gate structure, the gate structure including a silicon gate of a first thickness and an overlying sacrificial gate of a second thickness that is greater than the first thickness;
    forming a first sidewall spacer adjacent a sidewall of the gate structure, wherein forming the first sidewall spacer comprises forming a silicon oxide sidewall spacer adjacent a sidewall of the gate structure;
    forming a second sidewall spacer adjacent the first sidewall spacer, wherein forming the second sidewall spacer comprises forming a silicon nitride sidewall spacer adjacent the silicon oxide sidewall spacer;
    doping the semiconductor body to form a source region and a drain region that are self-aligned to the first and second sidewall spacers;
    after forming the source and drain regions, removing the sacrificial layer selectively to expose portions of the first sidewall spacer and the silicon gate, wherein selectively removing the sacrificial layer does not remove any portion of the first sidewall spacer;
    forming a metal layer over the source region, the drain region and the silicon gate; and
    reacting the metal layer with the source region, the drain region and the silicon gate to form a silicided source contact, a silicided drain contact and a fully silicided gate.

2. The method of claim 1 wherein forming the gate dielectric comprises forming a gate oxide.

3. The method of claim 1 wherein forming the gate dielectric comprises depositing a high-k dielectric.

4. The method of claim 1 wherein forming the silicon gate layer comprises depositing a polysilicon layer.

5. The method of claim 1, wherein removing the sacrificial layer comprises performing a titanium nitride etch using a solution that includes $NH_3$ and $H_2O_2$.

6. The method of claim 1, wherein removing the sacrificial layer comprises performing a titanium nitride etch using an aqueous solution that includes $NH_4OH$ and $H_2O_2$.

7. The method of claim 1, wherein forming the silicon nitride sidewall spacer comprises forming a $Si_3N_4$ sidewall spacer.

8. The method of claim 1, wherein the silicon nitride sidewall spacer is separated from the gate structure by the silicon oxide sidewall spacer.

9. The method of claim 1 wherein forming the metal layer comprises forming a nickel layer.

10. The method of claim 9 wherein forming the metal layer further comprises performing a chemical vapor deposition using $Ni(CO)_4$ as a precursor.

11. The method of claim 1 wherein forming the metal layer comprises depositing a refractory metal, the refractory metal being selected from the group consisting of cobalt, platinum, titanium, tantalum, and molybdenum.

12. The method of claim 1, further comprising removing unreacted portions of the metal layer after reacting the metal layer.

13. The method of claim 1, wherein the first thickness is between about 20 nm and about 60 nm and wherein the second thickness is between about 60 nm and about 100 nm.

14. The method of claim 1, wherein the fully silicided gate is not disposed on the first sidewall spacer.

15. The method of claim 1, wherein the second thickness is selected to form a gate stack comprising a thickness determined by a need to form the first and second sidewall spacers of necessary thickness.

16. The method of claim 1, wherein a combination of the first thickness and the second thickness is about 60 nm to about 100 nm.

17. A method of forming a transistor with a fully silicided gate, the method comprising:
    forming a gate dielectric over a semiconductor body;
    depositing silicon over the gate dielectric;
    depositing titanium nitride over the silicon;
    patterning the silicon and the titanium nitride to form a gate structure, the gate structure including a silicon gate of a first thickness and an overlying titanium nitride gate of a second thickness that is greater than the first thickness;
    forming a first sidewall spacer adjacent a sidewall of the gate structure, wherein forming the first sidewall spacer comprises forming a silicon oxide sidewall spacer adjacent a sidewall of the gate structure;
    forming a second sidewall spacer adjacent the first sidewall spacer, forming the second sidewall spacer comprises forming a silicon nitride sidewall spacer adjacent the silicon oxide sidewall spacer;
    implanting dopants into the semiconductor body aligned to the first and second sidewall spacers, the implanting forming a source region and a drain region adjacent the gate structure;
    after forming the source and drain regions, selectively removing the titanium nitride without substantially removing material of the first sidewall spacer, silicon of the silicon gate or silicon of exposed portions of the source region and the drain region;
    forming a metal layer over the source region, the drain region and the silicon gate; and
    reacting the metal layer with the source region, the drain region and the silicon gate to form a silicided source contact, a silicided drain contact and a fully silicided gate.

18. The method of claim 17 wherein selectively removing the titanium nitride comprises performing an etch using a solution that includes $NH_3$ and $H_2O_2$.

19. The method of claim 17 wherein selectively removing the titanium nitride comprises performing an etch using a solution that includes $NH_4OH$ and $H_2O_2$.

20. The method of claim 17, wherein the silicon oxide sidewall spacer is disposed between the silicon nitride sidewall spacer and the gate structure.

21. The method of claim 17 wherein forming the metal layer comprises forming a nickel layer.

22. The method of claim 21 wherein forming the metal layer further comprises performing a chemical vapor deposition using $Ni(CO)_4$ as a precursor.

23. The method of claim 17 wherein forming the gate dielectric comprises depositing a high-k dielectric.

24. The method of claim 17 wherein depositing silicon comprises depositing polysilicon.

25. The method of claim 17 wherein depositing silicon comprises depositing amorphous silicon.

26. The method of claim 17, wherein the first thickness is between about 20 nm and about 60 nm and wherein the second thickness is between about 60 nm and about 100 nm.

27. A method for forming a semiconductor device, the method comprising:
- forming a gate dielectric over a semiconductor body;
- forming a silicon gate layer over the gate dielectric;
- forming a conductive sacrificial layer over the silicon gate layer, wherein the conductive sacrificial layer comprises TiN;
- patterning the silicon gate layer and the conductive sacrificial layer to form a gate structure;
- forming a first sidewall spacer adjacent a sidewall of the gate structure, wherein the first sidewall spacer comprises $SiO_2$;
- forming a second sidewall spacer adjacent the first sidewall spacer, wherein the second sidewall spacer comprises $Si_3n_4$;
- doping the semiconductor body to form a source region and a drain region that are self-aligned to the first and second sidewall spacers;
- after forming the source and drain regions, removing the conductive sacrificial layer selectively to expose the silicon gate layer without removing any part of the first sidewall spacer;
- depositing a metal layer over the source region, the drain region and the silicon gate layer; and
- reacting the metal layer with the source region, the drain region and the silicon gate layer to form a silicided source contact, a silicided drain contact and a fully silicided gate, wherein the fully silicided gate is not disposed above the first sidewall spacer.

28. The method of claim 27, wherein the silicon gate layer comprises a first thickness and the overlying conductive sacrificial layer comprises a second thickness, wherein the second thickness is greater than the first thickness.

* * * * *